United States Patent
Chi et al.

(10) Patent No.: US 10,340,179 B2
(45) Date of Patent: Jul. 2, 2019

(54) VIA FORMATION USING DIRECTED SELF-ASSEMBLY OF A BLOCK COPOLYMER

(71) Applicant: International Business Machines Corporation, Armonk, NY (US)

(72) Inventors: Cheng Chi, Albany, NY (US); Kafai Lai, Poughkeepsie, NY (US); Chi-Chun Liu, Altamont, NY (US); Yongan Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/703,097

(22) Filed: Sep. 13, 2017

(65) Prior Publication Data

US 2019/0080958 A1    Mar. 14, 2019

(51) Int. Cl.
*H01L 21/02* (2006.01)
*H01L 21/311* (2006.01)
*H01L 21/768* (2006.01)

(52) U.S. Cl.
CPC .. *H01L 21/76816* (2013.01); *H01L 21/02118* (2013.01); *H01L 21/02356* (2013.01); *H01L 21/76897* (2013.01); *H01L 21/31133* (2013.01); *H01L 21/31138* (2013.01)

(58) Field of Classification Search
CPC ......... H01L 21/02118; H01L 21/31138; H01L 21/76816; H01L 21/76897; H01L 21/31133; H01L 21/76877; H01L 21/02112; H01L 21/76802
See application file for complete search history.

(56) References Cited

U.S. PATENT DOCUMENTS

| 8,114,306 | B2 | 2/2012 | Cheng et al. |
| 8,906,802 | B2 | 12/2014 | Wahl et al. |
| 9,111,067 | B2 | 8/2015 | Robles |
| 9,123,541 | B2 | 9/2015 | Xu et al. |
| 9,208,275 | B2 | 12/2015 | Wang et al. |
| 9,252,027 | B1 | 2/2016 | Kasahara et al. |
| 9,305,834 | B1 | 4/2016 | Latypov et al. |
| 2012/0015486 | A1* | 1/2012 | Millward ............ H01L 21/0337 438/128 |
| 2014/0170821 | A1* | 6/2014 | Nyhus ............... H01L 29/66666 438/268 |
| 2015/0168841 | A1 | 6/2015 | Matsunaga et al. |
| 2015/0197594 | A1 | 7/2015 | Xu et al. |
| 2015/0286139 | A1 | 10/2015 | Han et al. |

(Continued)

OTHER PUBLICATIONS

Chi et al.; "DSA via Hole Shrink for Advanced Node Applications"; IBM Research, Proc. of SPIE vol. 9777 (2016); 9 pages.

(Continued)

*Primary Examiner* — Jasmine J Clark
(74) *Attorney, Agent, or Firm* — Cantor Colburn LLP; Vazken Alexanian

(57) ABSTRACT

A method of forming an interconnect element includes forming a trench in a dielectric material. The trench has a width equal to twice a natural pitch of a block copolymer. The block copolymer includes a first polymer and a second polymer. The method includes filling the trench with the block copolymer.

20 Claims, 6 Drawing Sheets

(56) References Cited

U.S. PATENT DOCUMENTS

2016/0064027 A1\* 3/2016 Arora .................. G11B 5/84
 216/22
2016/0118295 A1 4/2016 Chan et al.
2017/0154810 A1\* 6/2017 Belledent .......... H01L 21/76816

OTHER PUBLICATIONS

Lai et al.; "Where are we in DTCO of DSA-based lithography?"; IBM Research Division, 2015 IEEE Lithography Workshop; 22 pages.
Liu et al.; "Directed Self-Assembly via Shrink Process with Lamella-forming Block Copolymers"; EIPBN 2015; 3 pages.

\* cited by examiner

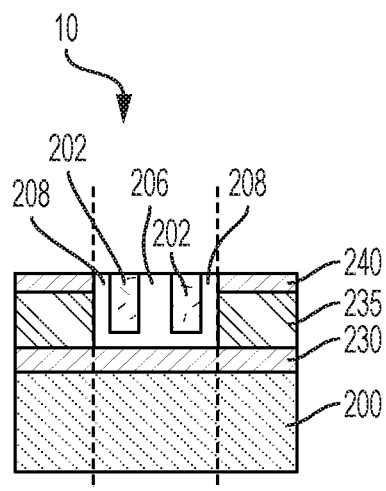
FIG. 2a
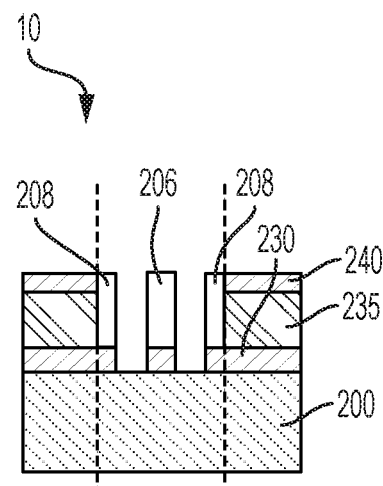
FIG. 2c
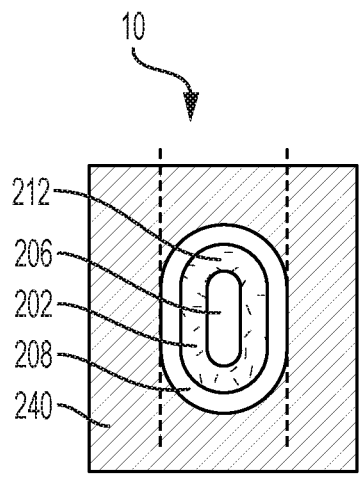
FIG. 2b
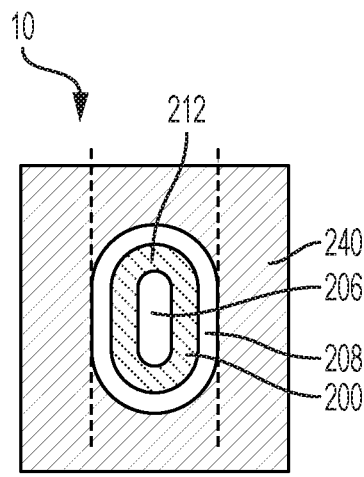
FIG. 2d
FIG. 2

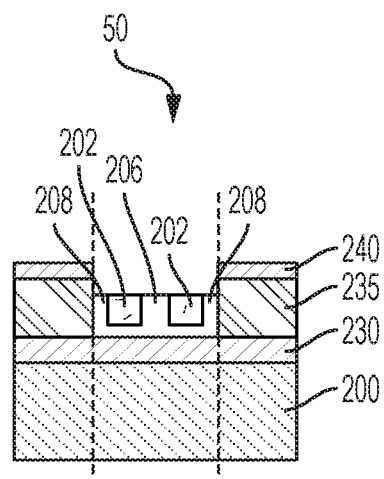
FIG. 6a
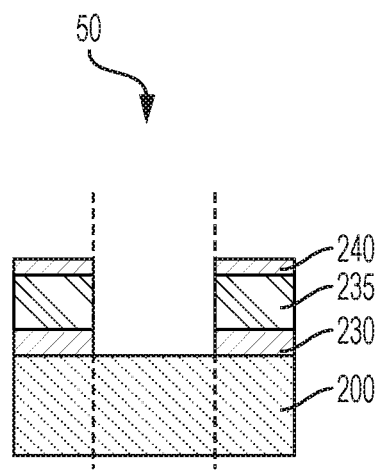
FIG. 6c
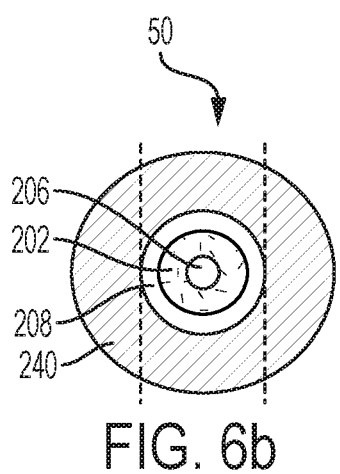
FIG. 6b
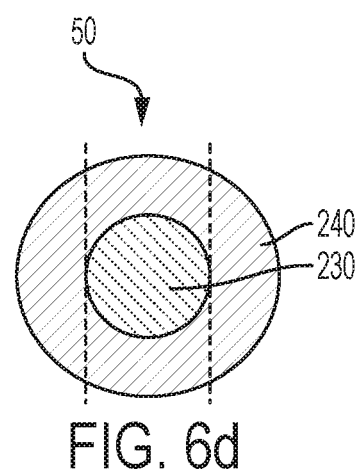
FIG. 6d
FIG. 6

VIA FORMATION USING DIRECTED SELF-ASSEMBLY OF A BLOCK COPOLYMER

BACKGROUND

The present invention relates in general to semiconductor device fabrication methods and resulting structures. More specifically, the present invention relates to fabrication methods and resulting structures for a semiconductor device having a vertical metal line interconnect (via) that is formed using directed self-assembly (DSA) of a block copolymer (BCP).

In contemporary semiconductor device fabrication processes a large number of semiconductor devices and conductive interconnect layers are fabricated in and on a single wafer. The conductive interconnect layers serve as a network of pathways that transport signals throughout an integrated circuit (IC), thereby connecting circuit components of the IC into a functioning whole and to the outside world. Interconnect layers are themselves interconnected by a network of holes (or vias) formed through the wafer. As IC feature sizes continue to decrease, the aspect ratio (i.e., the ratio of height/depth to width) of features such as vias generally increases. Fabricating intricate structures of conductive interconnect layers and vias within an increasingly smaller wafer footprint is one of the most process-intensive and cost-sensitive portions of semiconductor IC fabrication.

SUMMARY

Embodiments of the present invention are directed to a method of forming an interconnect element. A non-limiting example of the method includes forming a trench in a dielectric material. The trench has a width equal to twice a natural pitch of a block copolymer. The block copolymer includes a first polymer and a second polymer. The method includes filling the trench with the block copolymer.

Embodiments of the present invention are directed to an interconnect apparatus. A non-limiting example of the apparatus includes a trench in a dielectric material and a first polymer and a second polymer of a block copolymer in a pattern in the trench. The pattern includes a center portion including the first polymer of the block copolymer. A width of the center portion is equal to one half a natural pitch of a block copolymer. The pattern includes a middle portion on opposite sides of the center portion. The middle portion includes the second polymer of the block polymer material. The pattern includes an outer portion on opposite sides of the middle portion. The outer portion includes the first polymer of the block polymer material.

Embodiments of the present invention are directed to an interconnect apparatus. A non-limiting example of the apparatus includes a trench in a dielectric material. The trench has a width equal to twice a natural pitch of a block copolymer. The block copolymer includes a first polymer and a second polymer. The apparatus includes the first polymer and the second polymer filling the trench.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2a depicts a cross-sectional view of the structure shown in FIG. 1b, taken along the line A-A', according to one or more embodiments of the present invention;

FIG. 2b depicts a corresponding top-down view of the structure shown in FIG. 2a according to one or more embodiments of the present invention;

FIG. 2c depicts a cross-sectional view of the structure after a further processing operation according to one or more embodiments of the present invention;

FIG. 2d depicts a corresponding top-down view of the structure shown in FIG. 2c according to one or more embodiments of the present invention;

FIG. 6a depicts a cross-sectional view of the structure shown in FIG. 5, taken along line B-B', according to one or more embodiments of the present invention;

FIG. 6b depicts a corresponding top-down view of the structure shown in FIG. 6a according to one or more embodiments of the present invention;

FIG. 6c depicts a cross-sectional view of the structure after a further processing operation according to one or more embodiments of the present invention;

FIG. 6d depicts a corresponding top-down view of the structure shown in FIG. 6c according to one or more embodiments of the present invention.

Figure 1A:
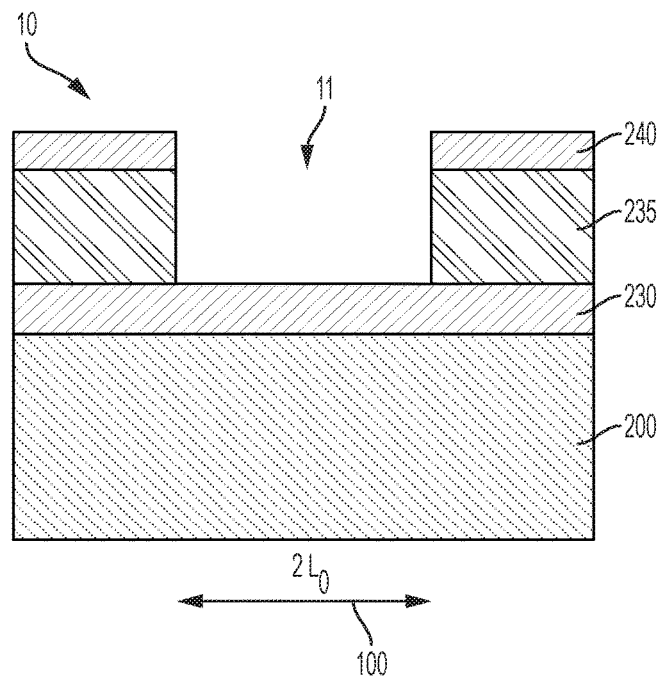
FIG. 1a depicts a cross-sectional view of a structure after a processing operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a more detailed description of technologies relevant to the present invention, the fabrication of very large scale integrated (VLSI) or ultra large scale integrated (ULSI) circuits requires an interconnect structure including metallic wiring that connects individual devices in a semiconductor chip to one another. The wiring interconnect network consists of two types of features that serve as electrical conductors, namely line features that traverse a distance across the chip, along with via features that connect lines in different levels. Typically, the conducting metal lines and vias include aluminum or copper and are electrically insulated by interlayer dielectrics (ILD).

To improve performance, the semiconductor industry has repeatedly shrunk the transistor gate length and the chip size. As a consequence the interconnect structure that forms the metallic circuitry has also shrunk. Minimal separation of conductive components, for example, vias filled with conductive material, and the design of guiding patterns that can implement conductive components with minimal separation is important.

DSA is a nanofabrication technique that can be used to form periodic structures, for example, vias, during semiconductor processing. Self-assembling BCP thin films are ordered using larger-scale, pre-defined trenches patterned by standard lithography. The BCP material properties control feature size and uniformity of resulting structures.

A BCP self-assembles into ordered morphologies having cylindrical or lamellar microdomains. For example, a lamellar microdomain structure includes alternating layers or regions of different materials, for example, blocks of the BCP. In some cases, DSA of the BCP is initiated or promoted by annealing the BCP after depositing the BCP in a trench. The molecular weight of a BCP dictates the sizes of the microdomains formed, and the molecular weight of a BCP can be adjusted. Adjusting the molecular weight of a BCP changes a natural pitch ($L_0$) of the BCP, or a characteristic center-to-center distance of microdomains formed, which is determined by intrinsic polymeric properties of the BCP. Thus, when the natural pitch of a BCP is set as a specification, the BCP is formulated accordingly, for example, by adjusting the molecular weight of the BCP.

Conventional methods for forming vias using DSA are typically based on a single pattern size cylinder type BCP or lamella type BCP process. These conventional methods are somewhat limited however, and cannot form extended vias as well as self-aligned closely spaced vias (also known as redundant vias). Moreover, because the via center-to-center distance is determined by the molecular weight of the BCP polymer, conventional methods cannot form vias that can align to metal lines with different pitches at the same time.

Turning now to an overview of the aspects of the invention, one or more embodiments of the invention provide method for forming structures by DSA of a BCP and resulting structures that allow for formation of extended vias as well as closely spaced vias. The vias are formed by removal of a block of the BCP included in a multi-phase lamellar pattern following annealing of the BCP, which has been deposited in a trench. The removed block can provide vias with an edge-to-edge separation equal to one half a natural pitch of the BCP. An edge-to-edge separation between vias equal to one half a natural pitch of the BCP is provided by filling a trench having a width equal to twice a natural pitch of the BCP with the BCP and then annealing the BCP to achieve the DSA of the multi-phase lamellar pattern.

Figure 1B:
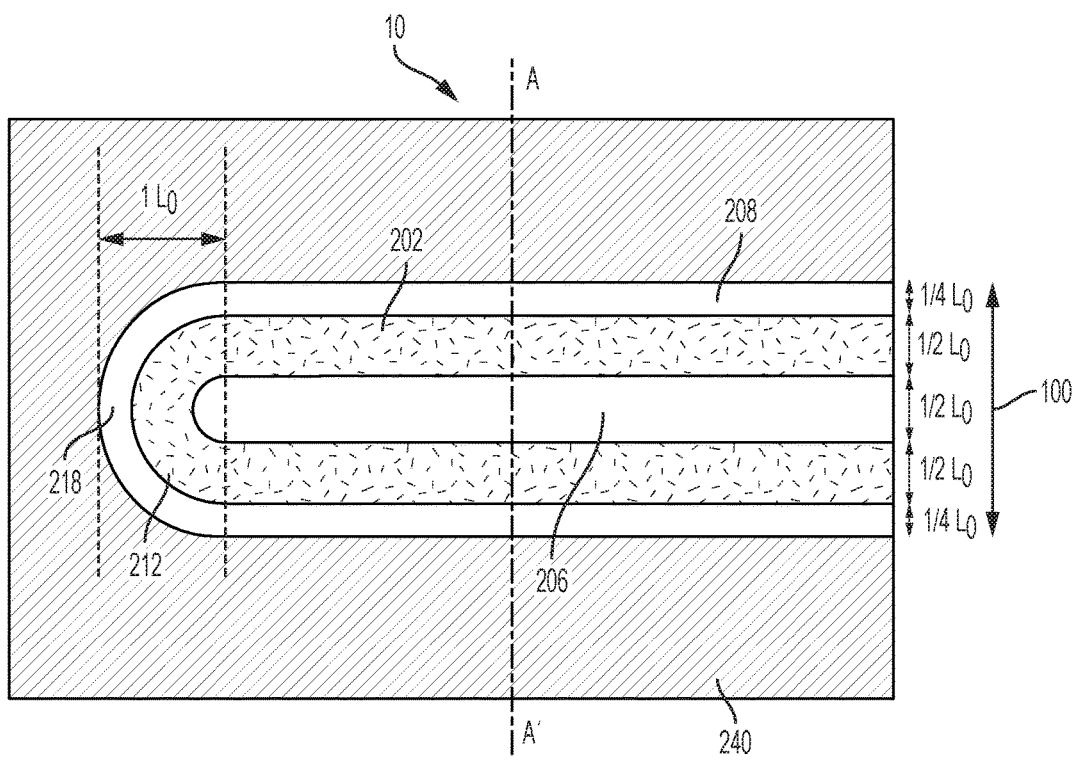
FIG. 1b depicts a top-down view of the structure after a processing operation according to one or more embodiments of the present invention.

Turning now to a more detailed description of aspects of the present invention, FIG. 1a depicts a cross-sectional view of a structure 10 including a trench 11, and FIG. 1b depicts a truncated top-down view of the structure 10, including a pattern that fills the trench 11 shown in FIG. 1a after a processing operation according to embodiments of the invention. The cross-section view of FIG. 1a is along line A-A' shown in FIG. 1b, prior to the trench 11 being filled.

As depicted in FIG. 1a, a trench 11 having a width 100 equal to twice a natural pitch of a BCP is formed in an intermediate layer 235, for example, a dielectric material, on an interconnect layer 200. The intermediate layer 235 is between the interconnect layer 200 and, for example, a metal line to which the interconnect layer 200 will be connected by a filled via. The intermediate layer 235 can be formed on a hard mask layer 230, which is formed on the interconnect layer 200. A hard mask layer 240 can be formed on the intermediate layer 235. In one or more embodiments of the invention, etching into the hard mask layer 240 and the intermediate layer 235 forms the trench 11. As depicted in FIG. 1b, annealing of the BCP cast in the trench 11 produces a pattern including a center portion 206, a middle portion 202 on opposite sides of the center portion 206, and an outer portion 208 on opposite sides of the middle portion 202.

Before annealing, a polymer solution including the BCP is cast within the trench 11. In one or more embodiments of the invention, the block copolymer formulation is applied by spin coating, e.g., at a spin speed from about 1 rpm to about 10,000 rpm, with or without a post-drying process. In one or more embodiments of the invention, another process such as spray-coating is used to apply the block copolymer formulation.

In one or more embodiments of the invention, the BCP includes a material selected from the group consisting of polystyrene-block-polymethylmethacrylate, polystyrene-block-polybutadiene, polystyrene-block-poly(2-vinyl pyridine), polystyrene-block-polydimethylsiloxane, and polystyrene-block-polyethylene oxide. In one or more embodiments of the invention, the BCP can be a block copolymer, e.g., di-block copolymer, of polystyrene and polymethylmethacrylate. The BCP can include one or more first blocks and two or more second blocks. The first block of the BCP can be polymethylmethacrylate (PMMA), and the second block can be polystyrene (PS).

The blocks can be a microdomain-forming block to which another, dissimilar block can be attached. The blocks can include, for example, polyolefins including polydienes, polyethers including poly(alkylene oxides) (such as poly (ethylene oxide), poly(propylene oxide), poly(butylene oxide), or random or block copolymers of these), poly ((meth)acrylates), polystyrenes, polyesters, polyorganosiloxanes, and polyorganogermanes.

The phrase "phase-separate" is used in this detailed description to refer to the propensity of the blocks of the block copolymers to form discrete microphase-separated domains, also referred to as "domains." The spacing and morphology of domains can depend on the interactions, volume fractions, and number of different blocks in the block copolymer. Domains of block copolymers, for example, block copolymers for which the glass transition temperature is lower than room temperature, can form spontaneously while applying them such as during a spin-casting step, or they can form as a result of an annealing step, which can increase the mobility of the block polymers. "Heating" or "baking" is a process in which the temperature of a material upon which the BCP is cast and coated layers thereon can be raised above ambient temperature. "Annealing" can include thermal annealing, thermal gradient annealing, solvent vapor annealing, or other annealing methods. Thermal annealing, sometimes referred to as thermal curing, can be used to induce phase separation, and in addition, can be used as a process for reducing or removing defects in the layer of lateral microphase-separated domains. Thermal annealing can involve heating at elevated temperature above the glass transition temperature of the block copolymers, for a period of time (e.g., several minutes to several days).

In one or more embodiments of the invention, annealing of a BCP including PMMA and PS includes a temperature between 150° C. and 300° C., for example, between 250° C. and 280° C., for a period of time between 2 minutes and 24 hours, for example, between 5 minutes and 15 minutes.

Solvents that can be used vary with the solubility requirements of the block copolymer components and the various additives, if present. Exemplary casting solvents for these components and additives include propylene glycol monomethyl ether acetate (PGMEA), ethoxyethyl propionate, anisole, ethyl lactate, 2-heptanone, cyclohexanone, amyl acetate, γ-butyrolactone (GBL), and toluene.

Additives can be selected from the group consisting of additional polymers (including homopolymers, star polymers and copolymers, hyperbranched polymers, block copolymers, graft copolymers, hyperbranched copolymer, random copolymers, crosslinkable polymers, and inorganic-containing polymers), small molecules, nanoparticles, metal compounds, inorganic-containing molecules, surfactants, photoacid generators, thermal acid generators, base quenchers, hardeners, cross-linkers, chain extenders, and combinations including at least one of the foregoing, in which one or more of the additives can co-assemble with the block copolymer to form part of one or more of the self-assembled domains.

In one or more embodiments of the invention, the BCP includes a first block, e.g., first polymer, and a second block, e.g., second polymer. The middle portion 202 includes the first block of the BCP, and the center portion 206 and outer portion 208 includes the second block of the BCP. The center portion 206 has a width equal to $L_0/2$ as measured in a direction of the minor axis 100 width of the pattern that fills the trench 11 shown in FIG. 1a. The middle portion 202 has a width equal to $L_0/2$ as measured in a direction of the minor axis 100 width of the pattern that fills the trench 11 shown in FIG. 1a. The outer portion 208 has a width equal to $L_0/4$ as measured in a direction of the minor axis 100 width of the pattern that fills the trench 11 shown in FIG. 1a. The middle portion 202 is formed on opposite longitudinal sides of the center portion 206, and the outer portion 208 is formed on opposite longitudinal sides of the middle portion 202. The center portion 206 and the middle portion 202 have a combined width equal to $3 L_0/2$ as measured in a direction of the minor axis 100 width of the pattern that fills the trench 11 shown in FIG. 1a.

The middle portion 202 includes two parallel portions, a first end portion 212 connecting first ends of the two parallel portion, and a second end portion (not shown) connecting second ends of the two parallel portions. The outer portion 208 includes two parallel portions, a first end portion 218 connecting first ends of the two parallel portion, and a second end portion (not shown) connecting second ends of the two parallel portions. In one or more embodiments of the invention, each end portion 218 of the outer portion 208 has a length equal to $L_0$ as measured in a direction orthogonal to the minor axis 100 width of the pattern that fills the trench 11 shown in FIG. 1a.

FIG. 2a depicts a cross-sectional view of the structure 10 shown in FIG. 1b, taken along the line A-A', and FIG. 2b depicts a corresponding non-truncated top-down view of the structure 10 shown in FIG. 1b. As depicted in FIG. 2a and FIG. 2b, the trench 11 shown in FIG. 1a is formed in an intermediate layer 235 on an interconnect layer 200. Further, similar to FIG. 1a, the intermediate layer 235 is between the interconnect layer 200 and, for example, a metal line to which the interconnect layer 200 will be connected by a filled via. The intermediate layer 235 can be formed on a hard mask layer 230, which is formed on the interconnect layer 200. A hard mask layer 240 can be formed on the intermediate layer 235. In one or more embodiments of the invention, etching into the hard mask layer 240 and the intermediate layer 235 forms a trench 11, as shown in FIG. 1a, in which each end portion of the outer portion 208 has a length equal to $L_0$ as measured in a direction orthogonal to the minor axis 100 width of the pattern that fills the trench 11, as shown in FIG. 1b.

In one or more embodiments of the invention, the first polymer is formed under the second polymer in the middle portion 202. Formation of the first polymer under the second polymer in the middle portion 202 can depend, for example, on the material of the hard mask layer 230.

FIGS. 2c and 2d depict the structure 10 after a further processing operation according to one or more embodiments of the invention. FIG. 2c depicts a cross-sectional view, and FIG. 2d depicts a top-down view. As depicted in FIGS. 2c and 2d, the first block of the BCP included in the middle portion 202, the second block of the BCP under the first block included in the middle portion 202, and the hard mask layer 230 under the first block included in the middle portion 202 are removed. The first block of the BCP included in the middle portion 202 is selectively removed, for example, by reactive ion etching (ME) or a wet development process (e.g., UV irradiation followed by solvent rinsing). During the selective removal of the first block, the second block included in center portion 206 and outer portion 208 is used as an etch template. In one or more embodiments of the invention, the first block is PMMA, the second block is PS, and the PMMA is selectively removed using the PS as a template.

The interconnect layer 200 can be formed on a substrate (not shown). The substrate can be of any suitable substrate material such as, for example, monocrystalline Si, SiGe, SiC, or semiconductor-on-insulator (SOI). Non-limiting examples of suitable materials for the substrate include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Figure 3:
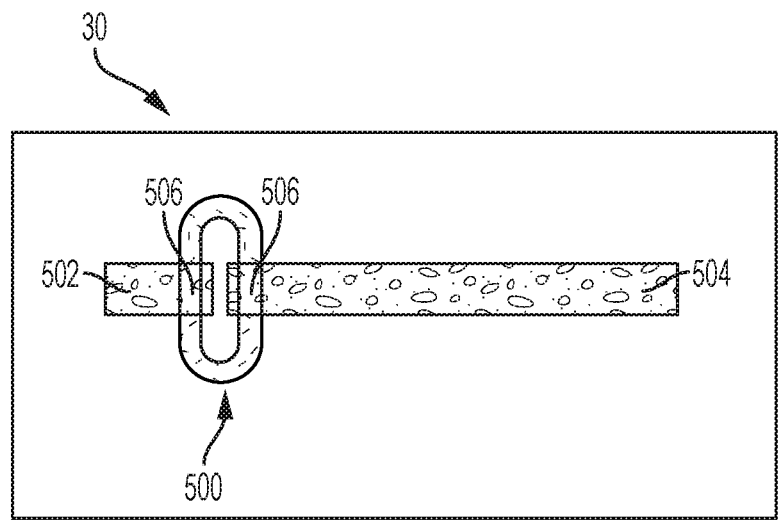
FIG. 3 depicts a top-down view of a structure after a processing operation according to one or more embodiments of the present invention.

FIG. 3 depicts a top-down view of a structure 30 after a processing operation according to one or more embodiments of the invention. As depicted in FIG. 3, straight portions 506 of guiding pattern (GP) 500 are separated by a distance of $L_0/2$, the width of the center portion 206 of the pattern that fills the trench 11 shown in FIG. 1a. GP 500 corresponds to the middle portion 202 of the pattern that fills the trench 11 shown in FIG. 1a, and the straight portions 506 of GP 500 correspond to vias formed by etching the first block.

The straight portions 506 of GP 500 underlie narrowly separated conductive portions, for example, metal lines 502, 504, of a structure 30. The vias formed by etching the first block are filled with conductive material. The filled vias contact the metal lines 502, 504, and the metal lines 502, 504 are interconnected through the filled vias and an underlying conductive layer. In one or more embodiments of the invention, the metal lines 502, 504 are on a top surface of the structure 30.

Figure 4:
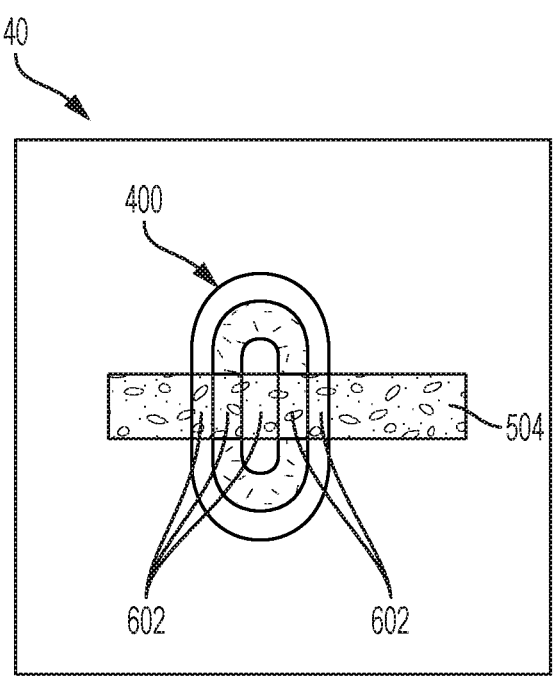
FIG. 4 depicts a top-down view of a structure after a processing operation according to one or more embodiments of the present invention.

FIG. 4 depicts a top-down view of a structure 40 after a processing operation according to one or more embodiments of the invention. As depicted in FIG. 4, in one or more embodiments of the invention, an extended via corresponding to a complete width 602 of pattern 400 underlying metal line 504 is formed by merging of vias formed by etching the first block, rather than providing for closely spaced vias.

Figure 5:
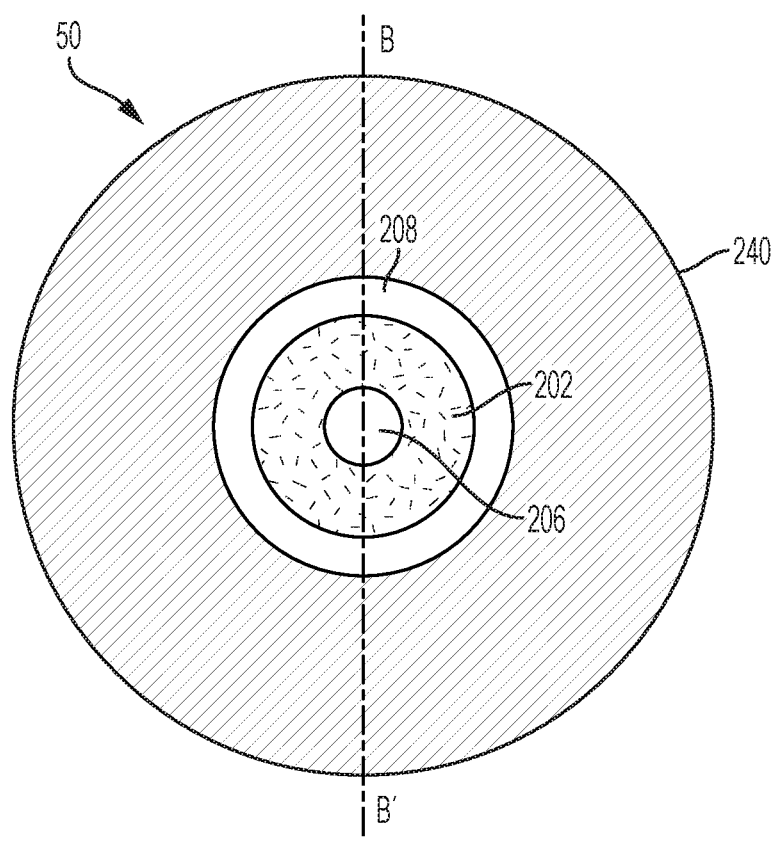
FIG. 5 depicts a top-down view of a structure after a processing operation according to one or more embodiments of the present invention.

FIG. 5 depicts a top-down view of a structure 50 after a processing operation according to one or more embodiments of the invention. As depicted in FIG. 5, an aspect ratio of a circular pattern that fills the trench 11 shown in FIG. 1a is equal to 1. The circular pattern that fills the trench 11 shown in FIG. 1a is circular and not elongated. FIG. 6a depicts a cross-sectional view of the circular pattern shown in FIG. 5, taken along line B-B' shown in FIG. 5, and FIG. 6b depicts a corresponding top-down view of the circular pattern shown in FIG. 5 after a processing operation according to one or more embodiments of the invention.

FIGS. 6c and 6d depict the structure 50 after a further processing operation according to one or more embodiments of the invention. FIG. 6c depicts a cross-sectional view, and FIG. 6d depicts a top-down view. As depicted in FIGS. 6c and 6d, the first block of the BCP included in the middle portion 202, the second block of the BCP, and the hard mask layer 230 under the first block and the second block of the BCP are removed by over-etching. In one or more embodiments of the invention, deposition of the block copolymer formulation, for example, by spin coating, is controlled such that the block copolymer formulation does not completely fill the trench 11 shown in FIG. 1a. An etch time for removal of the blocks formed by annealing is controlled to achieve over-etching, or removal of the first block of the BCP included in the middle portion 202, the second block of the BCP, and the hard mask layer 230 under the first block and the second block of the BCP, rather than the layers corresponding only to the middle portion 202 of the circular pattern.

Figure 7:
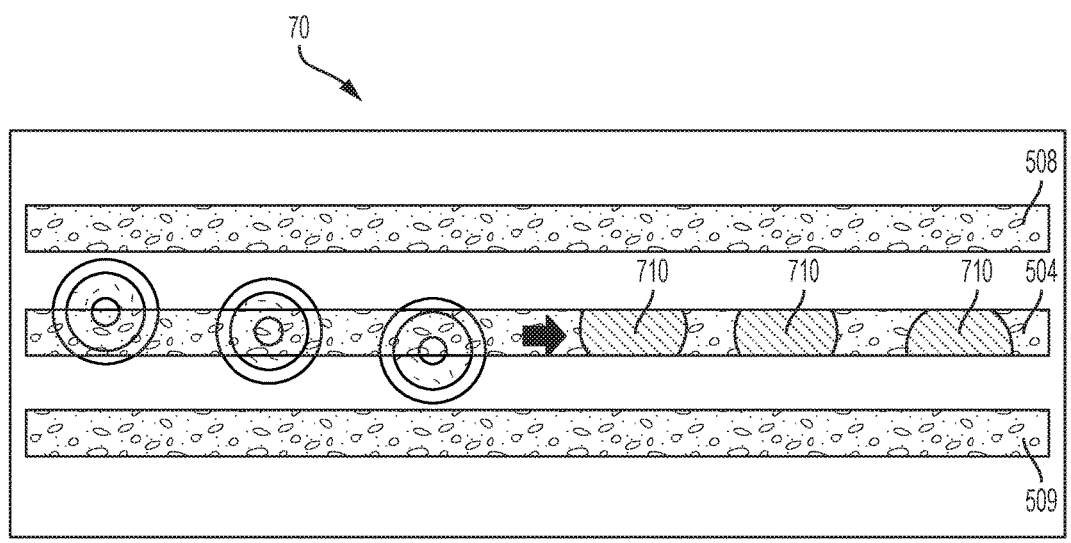
FIG. 7 depicts a top-down view of a structure after a processing operation according to one or more embodiments of the present invention.

FIG. 7 depicts a top-down view of a structure 70 after a processing operation according to one or more embodiments of the present invention. As depicted in FIG. 7, extended vias 710 underling metal line 504 are formed by over-etching the first block of the BCP included in the middle portion 202 of circular patterns as shown in FIG. 5 and depicted in the left-hand side of FIG. 7, the second block of the BCP, and the hard mask layer 230 under the first block and the second block of the BCP, as previously described herein.

Variations in areas of vias 710 due to, for example, positioning of the circular patterns 50, can be insignificant. Additionally, each of the vias 70 does not underlie more than one metal line 504, e.g., adjacent or neighboring metal lines 508, 509, and thus, a special placement rule for the circular pattern relative to the metal line 504 is not needed.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an interconnect element, the method comprising:
    forming a trench in a dielectric material, the trench having a width equal to twice a natural pitch of a block copolymer, the block copolymer comprising a first polymer and a second polymer, wherein the natural pitch is a characteristic center-to-center distance of microdomains formed during an annealing process of the block copolymer; and
    filling the trench with the block copolymer.

2. The method of claim 1 further comprising forming a pattern by directed self-assembly of the block copolymer.

3. The method of claim 2, wherein the pattern includes a center portion comprising the first polymer, a middle portion comprising the second polymer, the middle portion being on opposite sides of the center portion, and an outer portion comprising the first polymer, the outer portion being on opposite sides of the middle portion.

4. The method of claim 3, wherein forming the pattern by directed self-assembly of the block copolymer includes annealing.

5. The method of claim 3, wherein the center portion has a width equal to one half the natural pitch of the block copolymer.

6. The method of claim 3 further comprising removing the second polymer from the middle portion.

7. The method of claim 6 further comprising removing the first polymer from the center portion.

8. The method of claim 7 further comprising removing the first polymer from the outer portion.

9. The method of claim 1, wherein the block copolymer comprises a material selected from the group consisting of polystyrene-block-polymethylmethacrylate, polystyrene-block-polybutadiene, polystyrene-block-poly(2-vinyl pyridine), polystyrene-block-polydimethylsiloxane, and polystyrene-block-polyethylene oxide.

10. An interconnect apparatus comprising:
    a trench in a dielectric material; and
    a first polymer and a second polymer of a block copolymer in a pattern in the trench, the pattern comprising:

a center portion comprising the first polymer of the block copolymer, a width of the center portion being equal to one half a natural pitch of the block copolymer, wherein the natural pitch is a characteristic center-to-center distance of microdomains formed during an annealing process of the block copolymer;

a middle portion on opposite sides of the center portion, the middle portion comprising the second polymer of the block polymer material; and an outer portion on opposite sides of the middle portion, the outer portion comprising the first polymer of the block polymer material.

11. The apparatus of claim 10, wherein the middle portion comprises two parallel portions, a first end portion connecting first ends of the two parallel portion, and a second end portion connecting second ends of the two parallel portions, and a width of each of the two parallel portions of the middle portion is equal to one half a natural pitch of a block copolymer.

12. The apparatus of claim 11, wherein the outer portion comprises two parallel portions, a first end portion connecting first ends of the two parallel portion, and a second end portion connecting second ends of the two parallel portions, and a width of each of the two parallel portions of the outer portion is equal to one quarter a natural pitch of a block copolymer.

13. The apparatus of claim 12, wherein the pattern is circular in shape.

14. An interconnect apparatus comprising:

a trench in a dielectric material, the trench having a width equal to twice a natural pitch of a block copolymer, the block copolymer comprising a first polymer and a second polymer wherein the natural pitch is a characteristic center-to-center distance of microdomains formed during an annealing process of the block copolymer; and the first polymer and the second polymer filling the trench.

15. The apparatus of claim 14, wherein the first polymer and the second polymer are in a pattern, the pattern comprising a center portion comprising the first polymer, a middle portion comprising the second polymer, the middle portion being on opposite sides of the center portion, and an outer portion comprising the first polymer, the outer portion being on opposite sides of the middle portion.

16. The apparatus of claim 15, wherein the center portion has a width equal to one half the natural pitch of the block copolymer.

17. The apparatus of claim 16, wherein the middle portion comprises two parallel portions, a first end portion connecting first ends of the two parallel portion, and a second end portion connecting second ends of the two parallel portions.

18. The apparatus of claim 17, wherein a width of each of the two parallel portions of the middle portion is equal to one half the natural pitch of the block copolymer.

19. The apparatus of claim 18, wherein the outer portion comprises two parallel portions, a first end portion connecting first ends of the two parallel portion, and a second end portion connecting second ends of the two parallel portions.

20. The apparatus of claim 19, wherein a width of each of the two parallel portions of the outer portion is equal to one quarter the natural pitch of the block copolymer.

* * * * *